United States Patent
Xu et al.

(10) Patent No.: US 11,238,950 B1
(45) Date of Patent: Feb. 1, 2022

(54) RELIABILITY HEALTH PREDICTION BY HIGH-STRESS SEASONING OF MEMORY DEVICES

(71) Applicant: MICRON TECHNOLOGY, INC., Boise, ID (US)

(72) Inventors: Zhongguang Xu, San Jose, CA (US); Murong Lang, San Jose, CA (US); Zhenming Zhou, San Jose, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 19 days.

(21) Appl. No.: 16/925,222

(22) Filed: Jul. 9, 2020

(51) Int. Cl.
G11C 29/10 (2006.01)
G01R 31/311 (2006.01)
G11C 29/52 (2006.01)
G11C 29/04 (2006.01)

(52) U.S. Cl.
CPC ............ *G11C 29/10* (2013.01); *G01R 31/311* (2013.01); *G11C 29/04* (2013.01); *G11C 29/52* (2013.01)

(58) Field of Classification Search
CPC .... G01R 31/30; G01R 31/311; G01R 31/287; G01R 31/3016; G11C 29/42; G11C 29/52; G11C 29/04; G11C 29/10
See application file for complete search history.

(56) References Cited

U.S. PATENT DOCUMENTS

| 8,028,211 B1* | 9/2011 | Miller | G01R 31/3016 714/733 |
| 2003/0120457 A1* | 6/2003 | Singh | G01R 31/287 702/181 |
| 2015/0055409 A1* | 2/2015 | Karpov | G11C 13/0061 365/163 |

OTHER PUBLICATIONS

Barnett et al., Redundancy implications for early-life reliability: Experimental verification of an integrated yield-reliability model, IEEE, International Test Conference, Paper 24.3, pp. 693-699 (Year: 2002).*
Barnett et al., Estimating burn-in fall-out for redundant memory, IEEE pp. 340-347 (Year: 2001).*

* cited by examiner

*Primary Examiner* — Shelly A Chase
(74) *Attorney, Agent, or Firm* — Lowenstein Sandler LLP (57) ABSTRACT

An accelerated seasoning cycle criterion is associated with a memory die of a number of memory dies. The memory die is subjected to one or more accelerated seasoning conditions during accelerated seasoning cycles. Responsive to determining that the accelerated seasoning cycle criterion has been satisfied, a defect scan is performed on the memory die. The memory die is associated with a respective reliability bin of a plurality of reliability bins in view of a result of the defect scan, wherein the result of the defect scan satisfies one or more predetermined threshold reliability criteria corresponding to the respective reliability bin.

20 Claims, 8 Drawing Sheets

RELIABILITY HEALTH PREDICTION BY HIGH-STRESS SEASONING OF MEMORY DEVICES

TECHNICAL FIELD

Embodiments of the present disclosure relate generally to a memory sub-system, and more specifically, relate to predicting expected reliability of a memory device in the memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to pre-screening of memory dies before assembling the dies in memory devices in the memory sub-system based on reliability check of the memory dies after application of high-stress seasoning, also known as accelerated seasoning. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Another example is a three-dimensional cross-point ("3D cross-point") memory device that includes an array of non-volatile memory cells. A 3D cross-point memory device can perform bit storage based on a change of bulk resistance, in conjunction with a stackable cross-gridded data access array. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or three-dimensional grid. Memory cells are etched onto a silicon wafer in an array of columns (also hereinafter referred to as bitlines (BL)) and rows (also hereinafter referred to as wordlines (WL)). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. A 3D cross-point based memory device may be called a "drive", which has multiple dies layered in multiple "decks." A segment of a 3D cross-point memory device can encompass one or more decks, one or more dies, or one or more cells that are not necessarily physically contiguous but have some common characteristics, e.g., have a same electrical distance (ED) between wordlines (WL) and/or bitlines (BL).

In conventional memory sub-systems, the variation in temperature and/or processing drift can negatively impact the reliability of memory devices. For example, excessive temperatures used during a heating process in the assembly flow can, over a period of time, cause crystallization of areas of the memory device (e.g., amorphous phase change memory in reset memory cells). This crystallization can decrease resistivity of the memory cells, which, in turn, decreases the threshold voltage of the memory cells. This decreased resistivity can negatively impact reliability as the high voltage levels can cause voltage level instability, resulting in a higher error rate for the memory device during the operating lifetime of the memory sub-system.

For example, during the operating life of a memory device, the set state (e.g., a lower voltage level associated with a bit value of '1') and reset state (e.g., a higher voltage level associated with a bit value of '0') for a memory cell can register higher than expected voltage levels with respect to a predefined threshold voltage ($V_t$) read level. As such, a memory cell of a memory device that was programmed to a set state, could be interpreted by a read operation as a higher voltage level indicative of a reset state. This misinterpretation, in turn, can result in a higher error rate due to the drift in observed voltage levels that can impact the representative voltage state of the affected memory cells. While a write operation is performed to program a memory cell to a set state, the voltage state of the memory cell could indicate differently in response to a read operation as a result of the voltage level drift.

Conventional memory sub-systems that are configured in this manner typically address the resulting reliability issues by performing repetitive cycles of specialized read or write operations on the memory device to stabilize the voltage levels of the memory cells. During these "seasoning" cycles, voltage pulses are applied to the memory device to stabilize the voltage levels of the memory cells to predetermined set and reset voltage states.

In conventional memory sub-systems, the intensity and temporal variation of seasoning voltage pulses and the number of seasoning cycles that are applied to the memory devices are chosen based on conditions that the memory devices are expected to experience during its lifetime. For example, in conventional memory sub-systems, the wearing level of a memory device is assumed to be directly dependent on number of read/write cycles at normal operating conditions. However, conventional memory sub-systems do not employ a scheme to pre-screen memory dies before the dies are assembled into respective memory devices. Some memory dies can be defective from the beginning and can wear faster than other memory dies. As a result, the die-level performance can vary from one memory device to another, and there is a risk that overall device performance can be compromised because of a few sub-optimal dies in the memory device which is expected to meet certain reliability criteria.

Aspects of the present disclosure address the above and other deficiencies by pre-screening for sub-optimal dies at the onset before assembling a memory device consisting of multiple dies. Each memory device is associated with an expected level of performance and reliability. This disclosure describes a pre-assembly test setup that mimics a memory sub-system. The test setup applies accelerated stress-testing parameters, collectively known as "accelerated seasoning" or "high-stress seasoning" conditions, to the dies and based on the results of the stress-testing, associate each die with one of multiple predefined reliability categories ("reliability bins"). This categorization, in turn, determines whether the die should be assembled into a low-end memory device product with a low to moderate reliability expectation or in a high-end memory device product with a high reliability expectation. After a preset number of accelerated seasoning cycles is applied to a die, if a determined bit error rate does not satisfy an acceptable bit error rate associated with stabilized voltage levels of a memory device with a certain performance expectation, the die is not assembled into that memory device. The sub-optimal dies can be discarded altogether or included in a memory device with low reliability requirement. Note that under normal operating conditions, a read cycle constitutes transferring data from a memory device to a host, and a write cycle constitutes transferring data from the host to the memory device. The high-stress seasoning-based die screening scheme disclosed herein can be modified to be used as periodic calibration during an operational lifetime of the memory device as well during normal read/write cycles.

Advantages of the present disclosure include, but are not limited to, ability to screen sub-optimal dies that may cause reliability problems in a memory device and compromise data integrity. This screening effectively improves yield by reducing a defect metric, such as defective parts per million (DPPM). The seasoning process of the present disclosure can be used to predict wearing of various dies before the dies are assembled into a respective memory device. Additionally, embodiments of this disclosure can estimate data loss, guide pre-emptive system management decisions, and enable dynamic adjustment of various performance parameters of a memory device during its lifetime. Overall, this disclosure accomplishes improved memory management to ensure data integrity.

Figure 1:
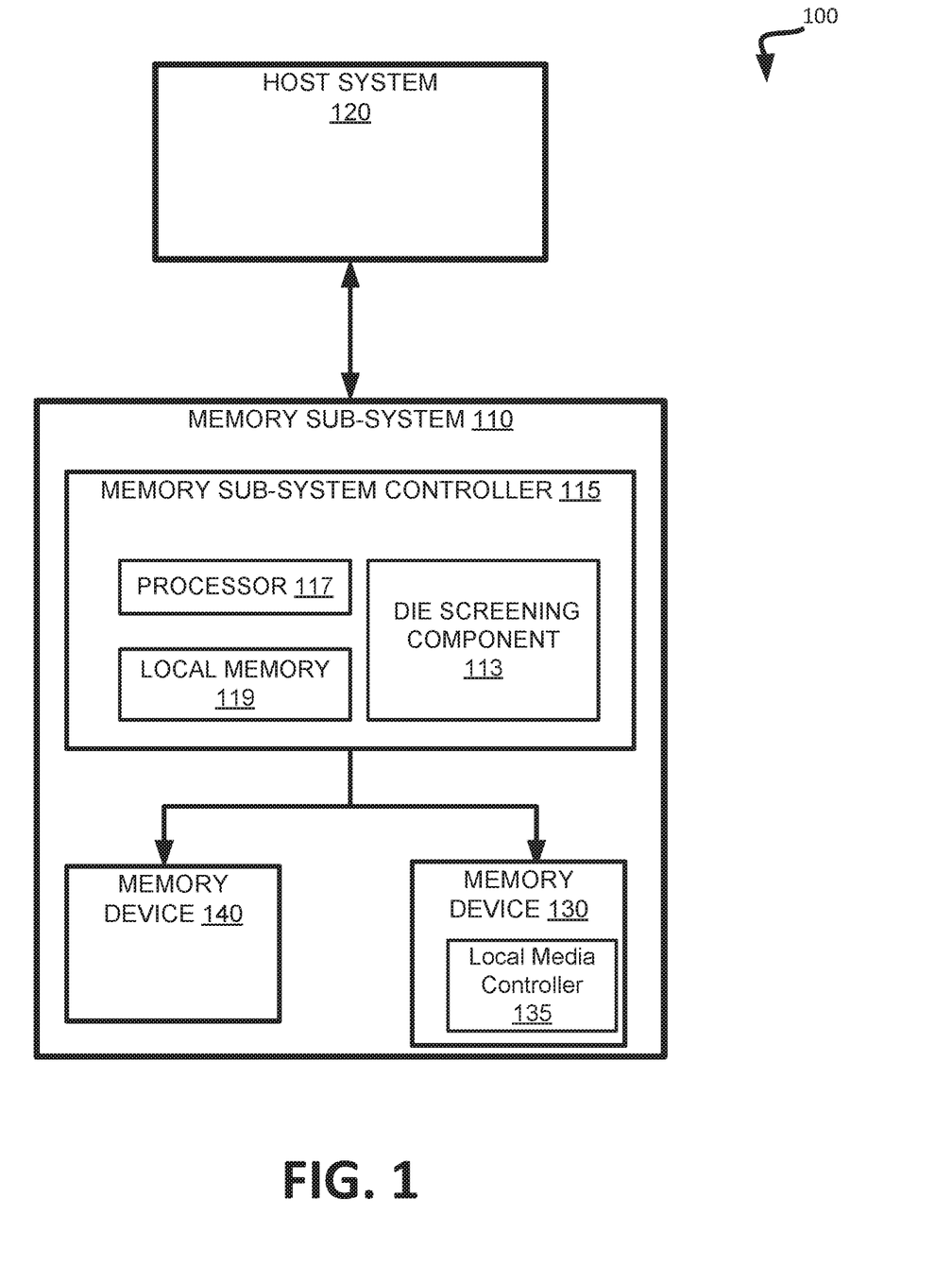
FIG. 1 illustrates an example computing system that includes a host system coupled with a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such. Note that in this disclosure, a reliability test setup mimics the memory sub-system 110.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA) namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 can additionally include a die screening component 113 that can be used to facilitate the operations for the memory devices 130. The operations include transferring data from a host to the memory device during the write cycles, and transferring data from the memory device to the host for the read cycles. Specifically, the die screening component 113 shown in FIG. 1 can be part of a test setup that pre-screens specific dies and categorize the specific dies to be assembled into a memory device with appropriate reliability rating. In some embodiments, the die screening component 113 may be part of a memory sub-system 110 having one or more assembled memory devices 130. In those embodiments, the die screening component 113 can dynamically change memory management parameters for the memory devices 130 based on a level of wearing during the memory device's operational lifetime. In some embodiments, the memory sub-system controller 115 includes at least a portion of die screening component 113. For example, the memory sub-system controller 115 can include a processor 117 (processing device) configured to execute instructions stored in local memory 119 for performing the operations described herein. In some embodiments, die screening component 113 is part of the host system 110, an application, or an operating system. In other embodiment, local media controller 135 includes at least a portion of die screening component 113 and is configured to perform the functionality described herein. Further details with regards to the operations of the die screening component 113 are described below.

Figure 2:
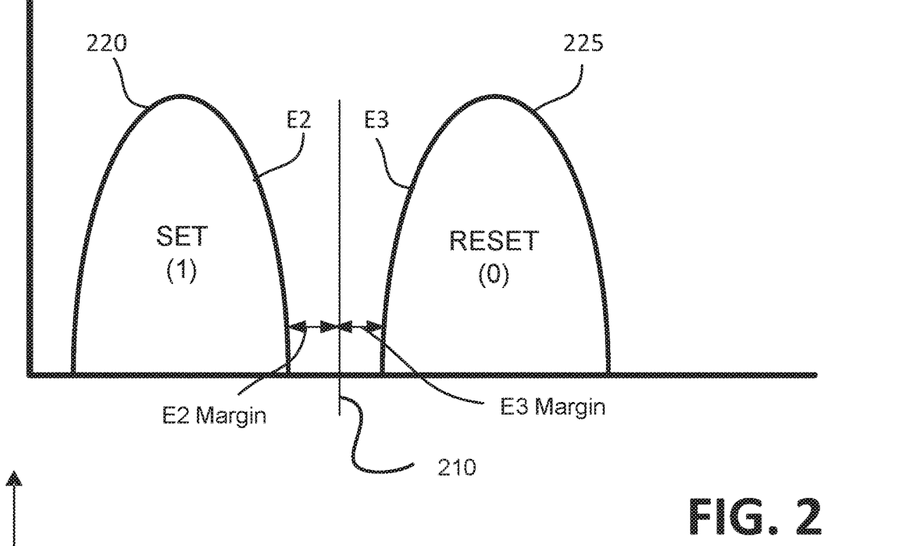
FIG. 2 illustrates voltage levels of memory cells in set and reset conditions and corresponding set and reset margins with respect to a reference voltage, in accordance with some embodiments of the present disclosure.

FIG. 2 illustrates voltage levels of memory cells in set and reset conditions and corresponding set and reset margins with respect to a reference voltage, in accordance with some embodiments of the present disclosure. The reference voltage can be a sensing voltage set for a read operation. As part of the die screening process, a processing device can determine some error parameter (e.g., bit error rate (BER) or codeword error rate (CWER), a codeword being a combination of original data plus corrected bits) associated with the memory cells of the memory device. In some embodiments, memory cells having a voltage state associated with a set state and memory cells having a voltage state associated with a reset state can have different error rates. The set state error rate and reset state error rate can be determined based on the voltage distributions associated with the set state and reset state respectively. The set state voltage distribution 220 can have a high edge "E2" and the reset state voltage distribution 225 can have a lower edge "E3". In such instances, the set state error rate can be determined based on a margin of the high edge (E2) of the set state from a reference voltage 210. This margin is called "set state margin" or E2 margin. Similarly, the reset state error rate can be determined based on a margin of the lower edge (E3) of the reset state from the reference voltage 210. This margin is called "reset state margin" or E3 margin. A processing device can select a set of memory cells that provide a representation of the voltage levels and E2/E3 margins for the entire memory device.

Figure 3:
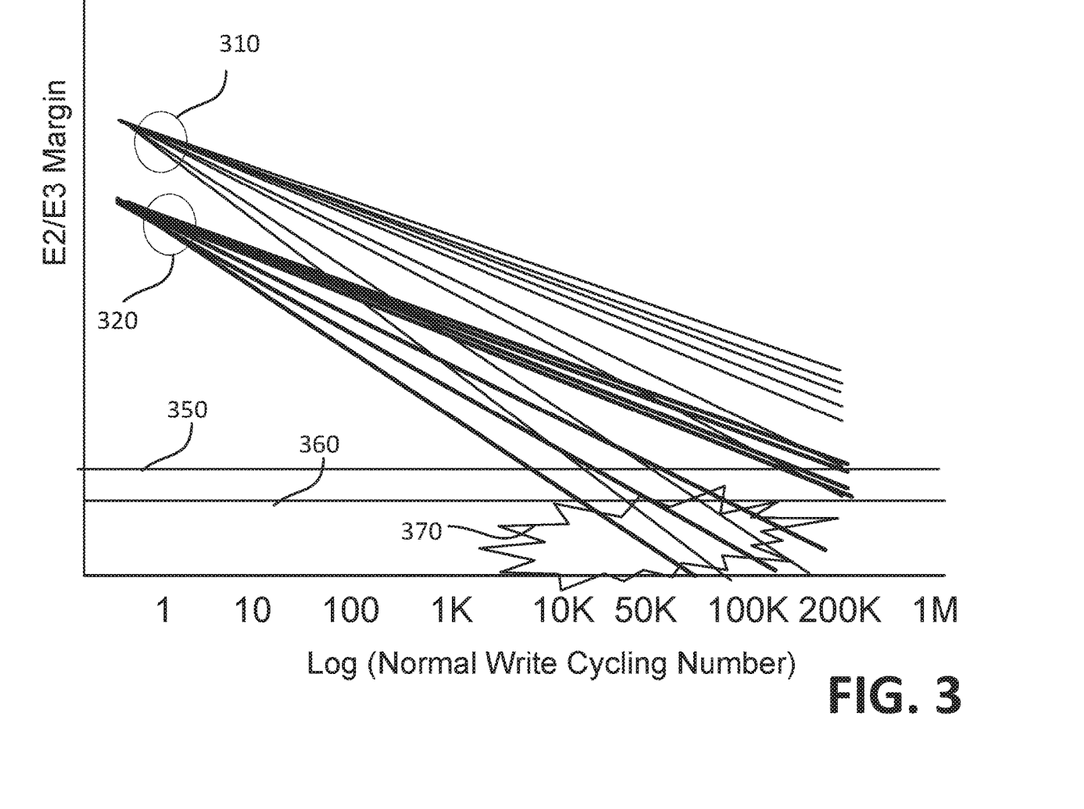
FIG. 3 illustrates die-level variation in degradation of set and reset margins with increased number of write cycles under normal operating conditions, in accordance with some embodiments of the present disclosure.

FIG. 3 illustrates die-level variation in degradation of set and reset margins for a number of memory dies with increased number of write cycles under normal operating conditions, in accordance with some embodiments of the present disclosure. Normal operating conditions can include using standard voltage pulses for a write cycle and/or a read cycle at room temperature. In FIG. 3, E2 and E3 margins of a number of memory dies are plotted against a logarithmic number of write cycles under a normal operating condition. Each line in the cluster 310 indicates the E2 margin of a particular die plotted against logarithmic number of write cycles. Each line in the cluster 320 indicates the E3 margin of a particular die plotted against logarithmic number of write cycles As noted above, for the same error rate, E2 margin and E3 margin can be different for the same die. In FIG. 3, E3 margin is lower than the E2 margin. In this case, the dies in the region 370 whose E3 margins degrade below a threshold E3 margin 360 after a specified number of write cycles can be pre-screened. The pre-screened dies can be discarded from being assembled into a memory device that needs to meet a certain error threshold, because E3 margin below the threshold 360 indicates unacceptably high error rate. Similarly, dies whose E2 margins degrade below a threshold E2 margin 350 after a specified number of write cycles can also be pre-screened.

Figure 4:
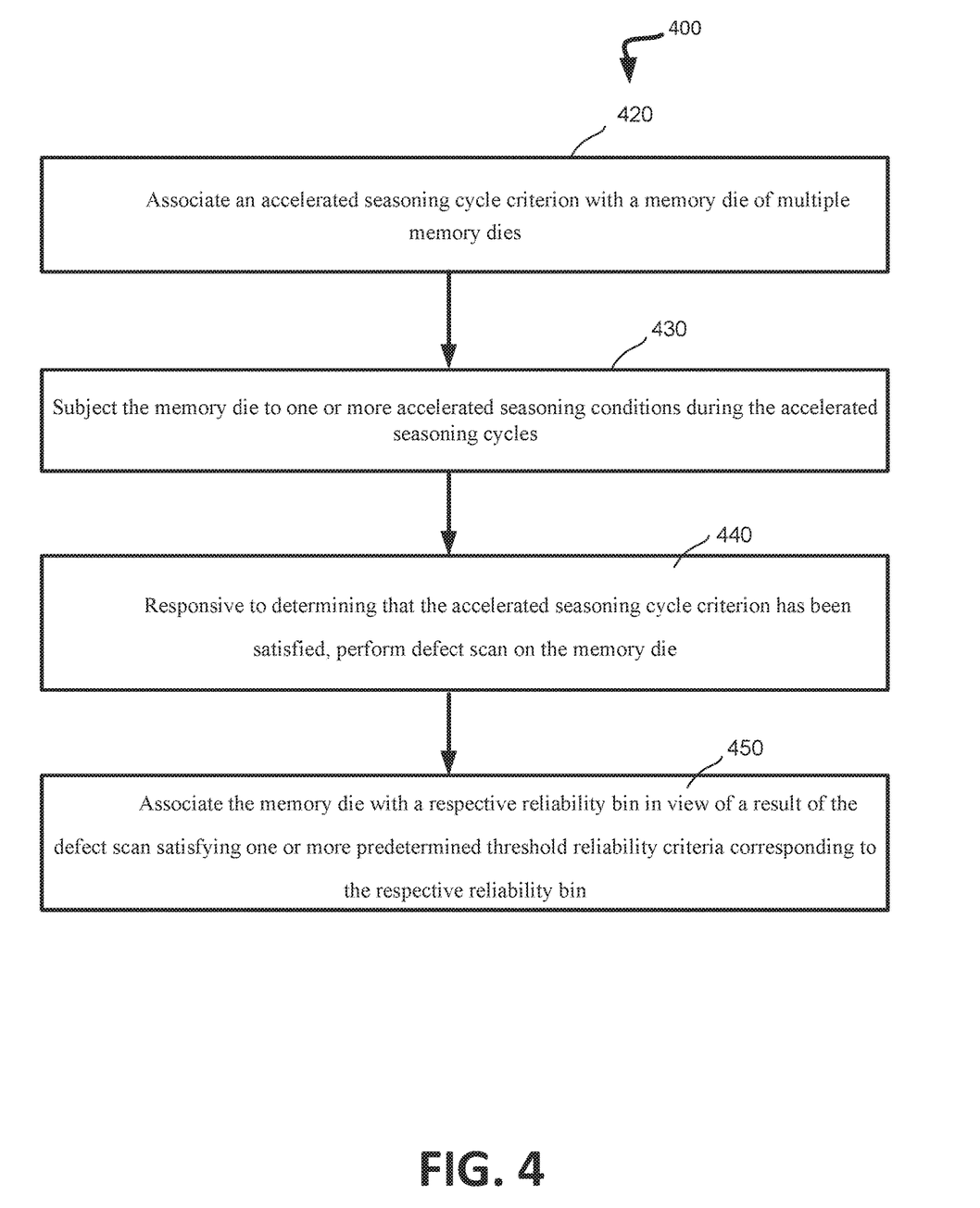
FIG. 4 illustrates a flow diagram of an example method of die screening based on accelerated seasoning cycling, in accordance with some embodiments of the present disclosure.

FIG. 4 is a flow diagram of an example method 400 of screening and categorizing memory dies into different reliability bins, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 can be performed by die screening component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Figure 5A:
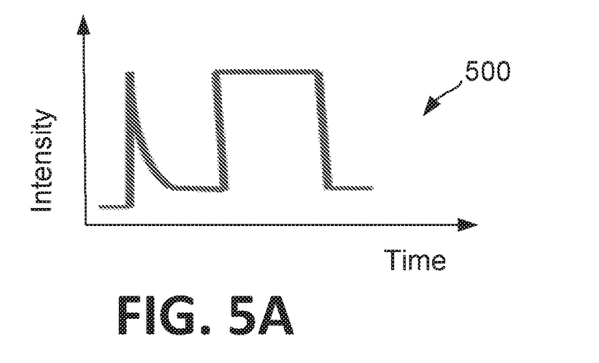
FIG. 5A illustrates a voltage pulse profile for accelerated seasoning cycles, in accordance with some embodiments of the present disclosure.
Figure 5B:
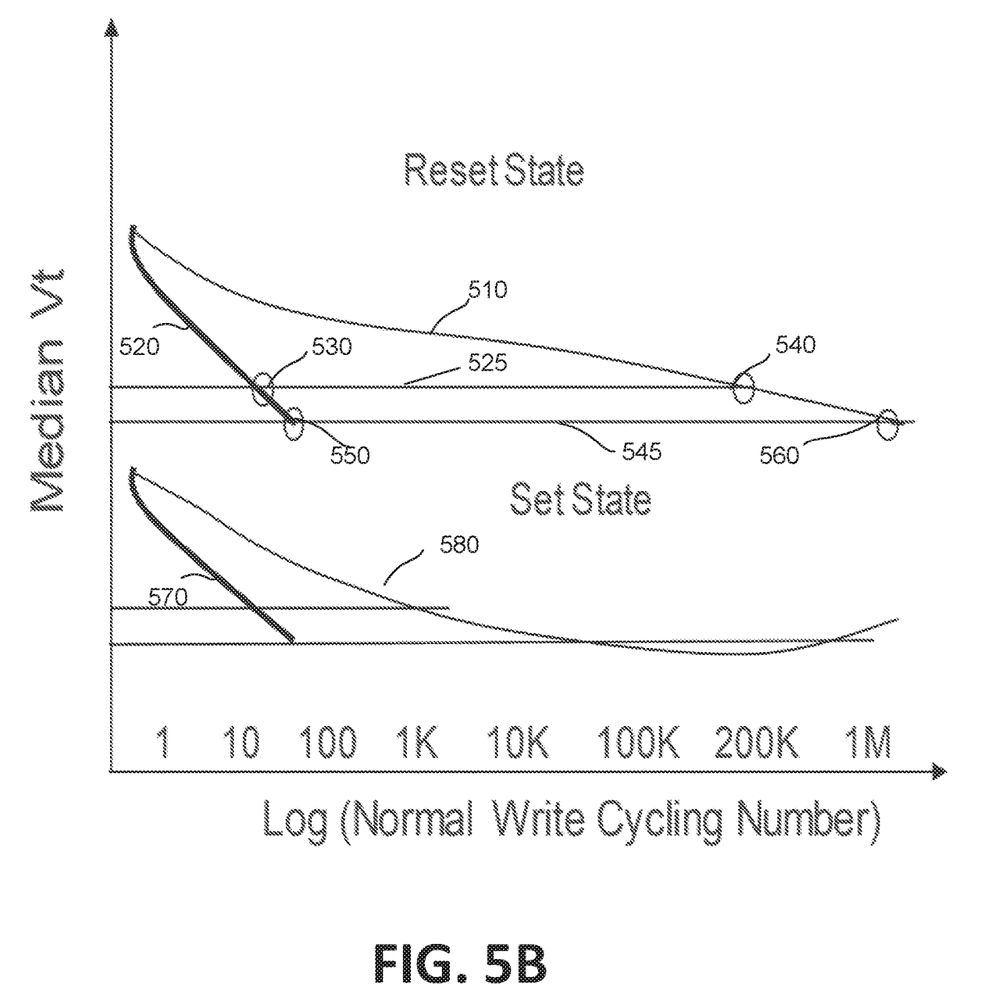
FIG. 5B illustrates correspondence between number of write cycling under normal operating conditions and under accelerated seasoning conditions, in accordance with some embodiments of the present disclosure.

At operation 420, the die screening component can associate an accelerated seasoning cycle criterion with a memory die of multiple memory dies. An example of associating an accelerated seasoning cycle criterion can be setting a threshold number of accelerated seasoning cycles for a memory die. Since accelerated seasoning involves high-stress conditions, such as a temperature that is substantially higher than room temperature, and/or a voltage pulse which is more aggressive that a normal operational voltage, the memory die experiences substantially the same level of wearing during accelerated seasoning much faster than it would have under normal read/write operations. The number of accelerated seasoning cycle is set according to this wear equivalence. For example, a voltage pulse pattern 500 shown in FIG. 5A can have higher intensity and longer duration for accelerated seasoning than the voltage pulse pattern used for normal write operation. Also, as an illustrative example, if for normal write operation, a room temperature is assumed to be 40° C., the temperature for accelerated seasoning can be 85° C. As shown in FIG. 5B, a median threshold voltage (Vt) degrades for accelerated seasoning much faster than the degradation seen during normal operation. As a non-limiting illustrative example, 100 cycles of accelerated seasoning at 85° C. can result in a wearing level equivalent to 200,000 cycles of normal operation at 40° C., as shown along the line indicating the reset state median Vt level 525. The curve 520 shows the Vt degradation for accelerated seasoning and the curve 510 shows the Vt degradation for the normal operation. The circle 530 where the curve 520 intersects the Vt level 525 indicates 100 cycles and the circle 540 where the curve 510 intersects the Vt level 525 indicates 200,000 cycles. Similarly, the circles 550 and 560 along the Vt level 545 indicate that 300 cycles of accelerated seasoning at 85° C. is equivalent to 1 million cycles of normal operation at 40° C. Note that the median voltage levels for the set states are generally lower than the median voltages of the reset state, but the same pattern of accelerated degradation of Vt level is observed in the set state as well between the curve 570 depicting accelerated seasoning and the curve 580 depicting normal operation. Generally, a test setup that applies accelerated seasoning attempts to mimic similar level of device wear during the device's operational lifetime. This is known as emulating "end-of-life" (EOL) cycling.

At operation 430, the die screening component subjects the memory die to the accelerated seasoning conditions during the accelerated seasoning cycles. For example, a voltage pulse like 500 can be applied to a memory die at a temperature (e.g., 85° C.) that is substantially higher than room temperature.

Figure 6:
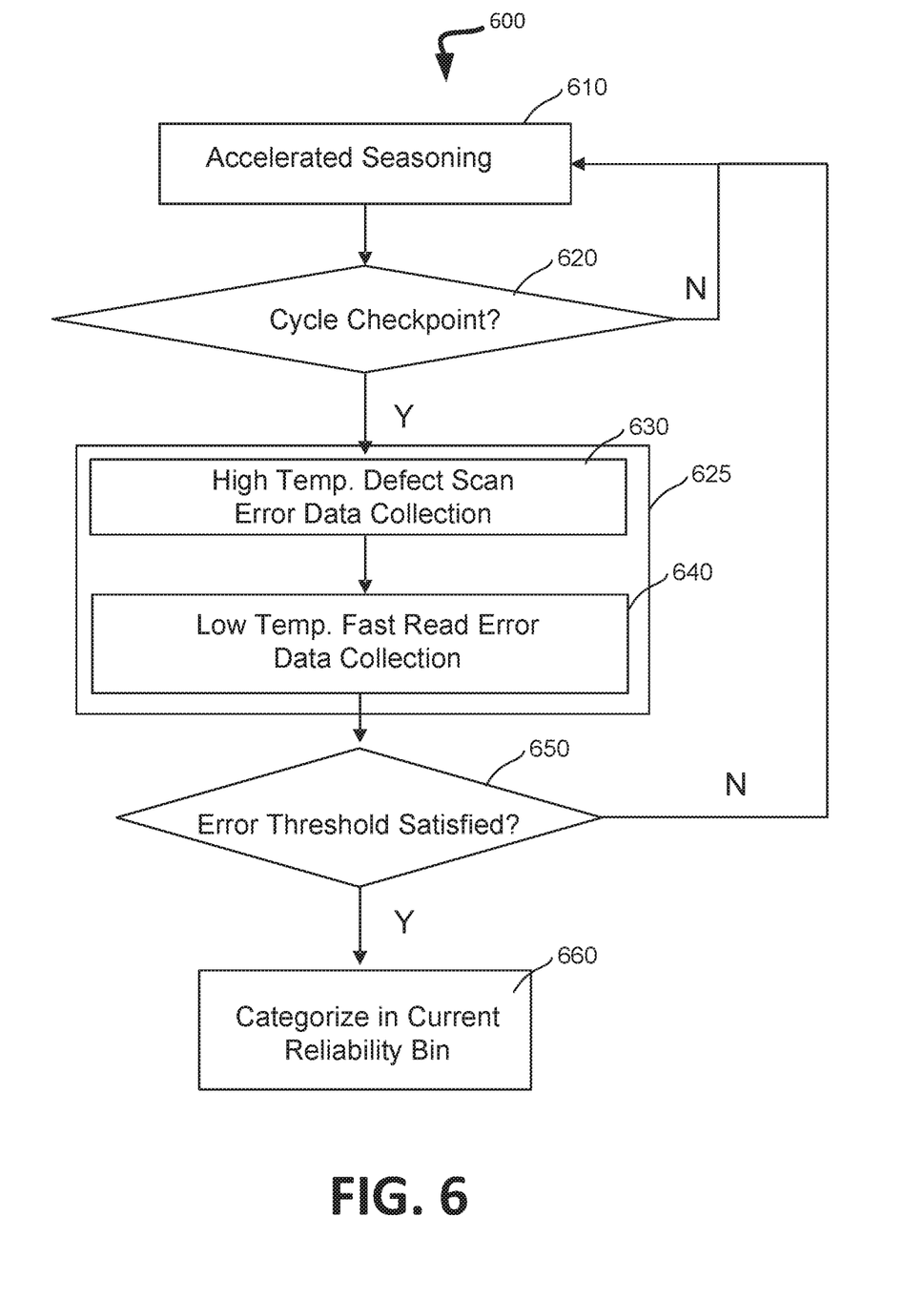
FIG. 6 illustrates a flow diagram of an example method of die categorization based on high-temperature and low-temperature tests for error data collection, in accordance with some embodiments of the present disclosure.

At operation 440, the die screening component determines that the accelerated seasoning cycle criterion has been satisfied. For example, the dies screening component can determine that a threshold number of accelerated seasoning cycles has been completed. The operation then proceeds to defect scanning. The purpose of defect scanning is monitoring reliability at certain checkpoints. Defect scanning can involve various tests to collect error data that represents the current level of wear of the memory die. One possible test is varying write-to-read (W2R) delay time at high temperature and collecting data that represents E2 margin degradation. For example, a short W2R delay time can be set to be 25 µs, while a long W2R delay time can be 100 ms. Median Vt (as shown in the plots in FIG. 5B) at a statically significant point along the Vt distribution plot (such as curve 220 in FIG. 2) is a good indication of E2 margin degradation, which can predict die failure, as shown in FIG. 3. Defect scanning can involve more than one tests for determining both E2 as well as E3 degradation. FIG. 6 elaborates this concept in further detail. For example, a fast read test can indicate E3 margin degradation. Die failure criteria can be defined by a user by configuring or training the die screening component 113.

Figure 8:
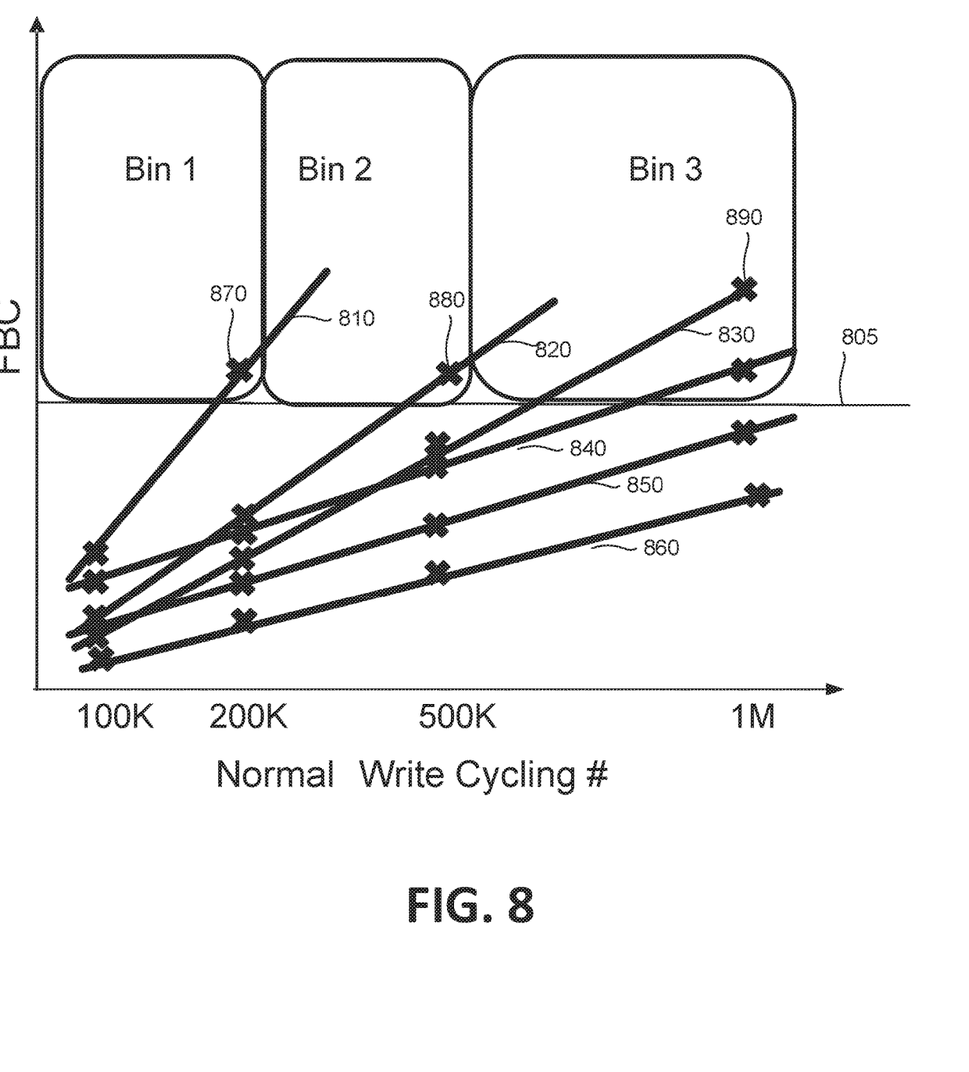
FIG. 8 illustrates a plot showing device-level reliability bin categorization, in accordance with some embodiments of the present disclosure.

At operation 450, the defect screening component associates the memory die with a respective reliability bin in view of a result of the defect scan. A number of reliability bins can be predefined to categorize the multiple memory dies based on various reliability criteria. For example, bin 1 can be assigned for memory dies that can withstand below 200,000 cycles. Similarly, bin 2 can be assigned for memory dies that can withstand below 200,000-500,000 cycles, bin 3 can be assigned for memory dies that can withstand 500,000-1 million cycles, and so forth. Note that number of bins and number of cycles associated with each bin can be user-defined. Memory dies in different bins can be reserved for different products. For example, memory dies in bin 1 can be reserved for lower-end memory devices with low expectation of reliability, and memory dies in bin 3 can be reserved for higher-end memory devices with high expectation of reliability. The die screening component can associate one or more predetermined threshold reliability criteria for each reliability bin of a number of reliability bins. Examples of reliability bins are shown in FIG. 8. Examples of reliability criteria can include, but are not limited to, number of failed bits (known as Failed Bit Count (FBC)) at a certain threshold error rate. The error rate can be raw bit error rate (RBER) or codeword error rate (CWER), i.e. error rate that is obtained after error correction algorithms have been applied. CWER is a good indicator of a sub-optimal die, because even after error correction, the die cannot meet the reliability criteria. Pre-screening these types of sub-optimal dies at the beginning using a test setup prevents the defective die to be included in an assembled memory device associated with a specified reliability rating.

FIG. 6 is a flow diagram of an example method 600 elaborating the die categorization process based on error data collection as mentioned in operation 440 of method 400, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 can be performed by a processing device in firmware of the memory sub-system coupled to the die screening component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. This operation can be periodically performed for each memory segment in a memory device.

At operation 610, the die screening component in a test setup subjects a memory die to accelerated seasoning conditions, as described in method 400. The die screening components predetermines multiple checkpoints during the accelerated seasoning test. Each checkpoint corresponds to a cycle threshold criterion. The cycle threshold criterion can be a number of accelerated seasoning cycles that is equivalent to a number of operational cycles to result in equivalent device wear, as discussed above with respect to method 400. Each checkpoint can be tied to a corresponding reliability bin. For example, a first checkpoint can be set at the number of accelerated seasoning cycles that is equivalent to 200 k of normal operational cycles.

At operation 620, the die screening component determines whether a number of accelerated seasoning cycles performed on a memory die satisfies the cycle threshold criterion for a first checkpoint. The operation at 610 is repeated until that threshold criterion is satisfied.

At operation 625, responsive to determining that the number of accelerated seasoning cycles satisfies the cycle threshold criterion for the first checkpoint, the die screening component determines an error rate associated with the memory die. A processing device coupled to the die screening component can determine the error rate based on one or more tests to collect error data. In certain embodiments, both the operations 630 and 640 can be used for determining error rate. In certain other embodiments, one of operations 630 and 640 can be omitted. In certain other embodiments, alternative error collection operations can be chosen which are different from the operations 630 and 640.

At operation 630, the die screening component performs high temperature defect scan for error data collection. For example, the high temperature can be 85° C. The collected error data from defect scan can indicate E2 margin degradation data that can be correlated with a certain predetermined error rate for a certain W2R delay (e.g., W2R delay of 100 ms) at a certain checkpoint.

At operation 640, a fast read error data is collected at low temperature (e.g., 0° C.), which can be correlated to E3 margin degradation. Fast read indicates a read operation immediately after a write operation with a typical delay in a microsecond range. For example, a W2R delay time can be set at 25 μs. A number of fast read operations can be 100, though other numbers can be selected. Either or both of E2 and E3 margin degradation can be tied to an error threshold criterion.

Figure 7:
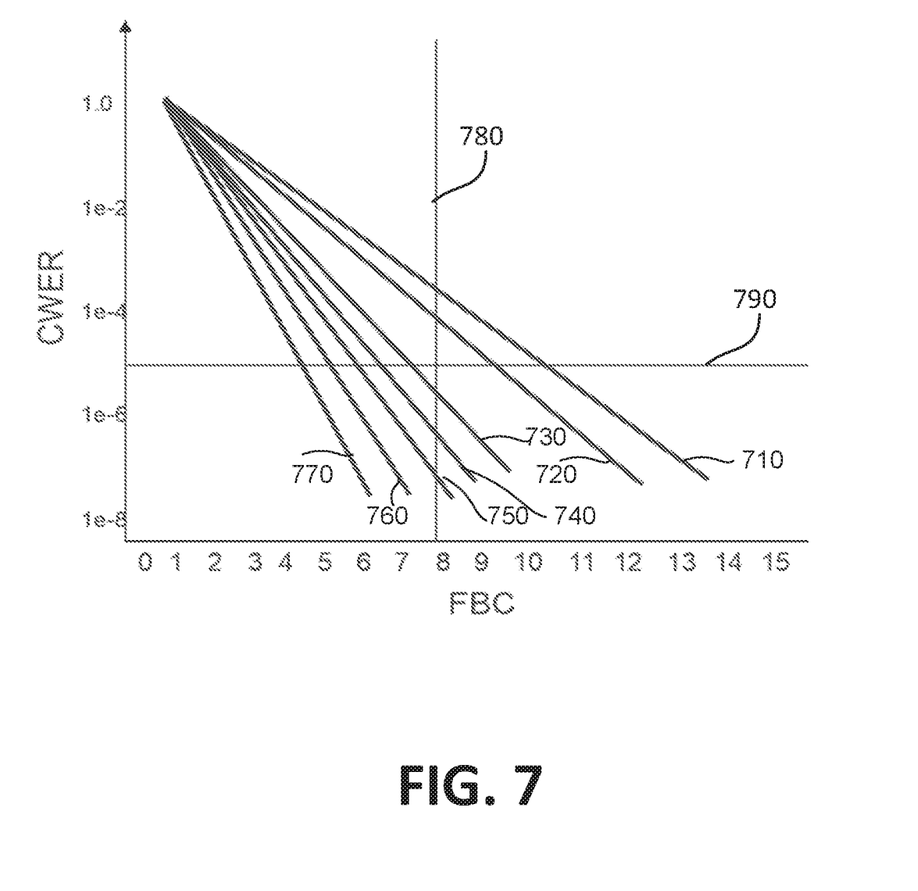
FIG. 7 illustrates setting up an error threshold criterion to define reliability bins, in accordance with some embodiments of the present disclosure.

At operation 650, the die screening component determines whether an error threshold criterion is satisfied. FIG. 7 shows one such example of error threshold criterion set by a user or automatically chosen by the die screening component based on historical data. Each line 710, 720, 730, 740, 750, 760 and 770 in FIG. 7 indicates variation of codeword error rate (CWER) for a corresponding memory die. The error threshold criterion can be set to be using a combination of FBC and CWER. For example, a criterion can be chosen where at a cycle threshold of 200 k for a W2R delay time of 100 ms, the FBC should be less than or equal to 8 (shown by 780). For the same cycle threshold and W2R delay time, the CWER shoed be less than $1e^{-5}$ (shown by 790).

At operation 660, the dies that do not meet the error threshold criterion at operation 650, are placed in a first reliability bin (e.g., bin 1 shown in FIG. 8). On the other hand, the dies that do meet the error threshold criterion, are not immediately placed into a reliability bin, but are subjected to additional cycles of accelerated seasoning until a next cycle threshold is satisfied. This process is repeated until the maximum number of accelerated seasoning cycle mimics the end-of-life (EOL) cycling of the memory die in terms of normal operational cycle equivalence, as shown in FIG. 5B.

FIG. 8 shows the multiple reliability bins corresponding to various threshold cycles. Each line 810, 820, 830, 840, 850 and 860 corresponds to a respective die that is being subjected to accelerated seasoning. The error threshold criterion is set at FBC less than equal to 8 at CWER of $1e^{-5}$ (indicated by the line 805). The die corresponding to line 810 belongs to bin 1, as it crossed the error threshold at the first checkpoint of 200 k cycles. But the die corresponding to line 820 had an FBC below the error threshold at the first checkpoint of 200 k cycles, so the cycle count was increased to the next cycle threshold value of 500 k. This die is placed in bin 2 because it crossed the error threshold value at the next checkpoint of 500 k cycles. Following similar process, the dies corresponding to lines 830 and 840 are placed in bin 3 as they can withstand upto 1 million cycles before crossing the error threshold.

Figure 9:
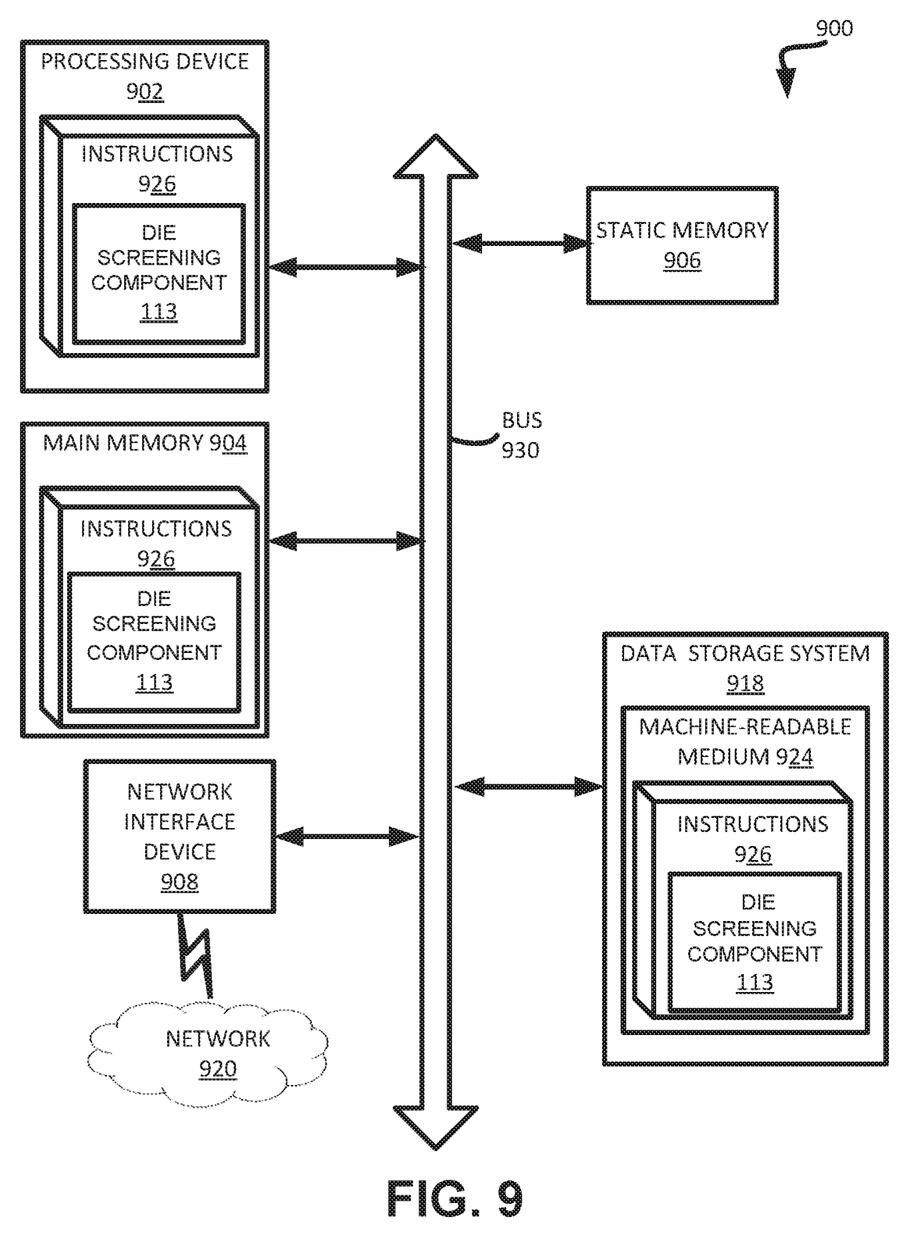
FIG. 9 illustrates a block diagram of an example computer system in which implementations of the present disclosure can operate.

FIG. 9 illustrates an example machine of a computer system 900 within which a set of instructions, for causing the machine to perform any one or more of the methodologies discussed herein, can be executed. For example, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the die screening component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage device 918, which communicate with each other via a bus 930.

Processing device 902 represents one or more general-purpose processing devices such as a microprocessor, a central processing unit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920. The data storage device 918 can include a machine-readable storage medium 924 (also known as a computer-readable medium) on which is stored one or more sets of instructions or software 926 embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage device 918, and/or main memory 904 can correspond to the memory sub-system 110 of FIG. 1.

In one implementation, the instructions 926 include instructions to implement functionality corresponding to a specific component (e.g., die screening component 113 of FIG. 1). While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving" or "servicing" or "issuing" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

What is claimed is:

1. A method, comprising:
   associating an accelerated seasoning cycle criterion with a memory die of a plurality of memory dies;
   subjecting the memory die to one or more accelerated seasoning conditions during accelerated seasoning cycles;
   responsive to determining, by a processing device, that the accelerated seasoning cycle criterion has been satisfied, performing a defect scan on the memory die; and
   associating, by the processing device, the memory die with a respective reliability bin of a plurality of reliability bins in view of a result of the defect scan, wherein the result of the defect scan satisfies one or more predetermined threshold reliability criteria corresponding to the respective reliability bin.

2. The method of claim 1, further comprising:
   selecting one or more memory dies from the respective reliability bin to assemble a memory device with a predetermined reliability rating.

3. The method of claim 1, wherein subjecting the memory die to one or more accelerated seasoning conditions comprises subjecting the memory die to a temperature substantially higher than room temperature during the accelerated seasoning cycles.

4. The method of claim 3, wherein performing a defect scan further comprises:
   collecting error data corresponding to one or more predetermined write-to-read delay times; and
   determining, in view of the error data, a degradation of a set margin of the memory die with respect to a reference voltage.

5. The method of claim 4, wherein performing a defect scan further comprises:
   subjecting the memory die to a temperature substantially lower than room temperature;
   performing a predetermined number of fast read operations on the memory die;

collecting error data corresponding to the fast read operations; and determining, in view of the error data corresponding to the fast read operations, a degradation of a reset margin of the memory die with respect to the reference voltage.

6. The method of claim 1, further comprising:

responsive to determining, after a first threshold number of accelerated seasoning cycles, that the result of the defect scan satisfies the one or more predetermined threshold reliability criteria corresponding to the first reliability bin, increasing a number of accelerated seasoning cycles to a next higher threshold number.

7. The method of claim 6, wherein a maximum number of accelerated seasoning cycles corresponds to a total number of operational cycles that the memory die is expected to experience during an operational lifetime after being assembled into a memory device.

8. A system comprising:

a test set up comprising a plurality of memory dies; and a processing device, operatively coupled to the plurality of memory dies, to perform screening operations for each of the plurality of memory dies, the screening operations comprising:

predetermining a plurality of checkpoints during an accelerated seasoning test, wherein each checkpoint of the plurality of checkpoints corresponds to a cycle threshold criterion;

determining whether a number of accelerated seasoning cycles performed on a memory die satisfies a cycle threshold criterion for a first checkpoint;

responsive to determining that the number of accelerated seasoning cycles satisfies the cycle threshold criterion for the first checkpoint, determining an error rate associated with the memory die;

determining whether the error rate satisfies an error threshold criterion specific to a predetermined reliability rating; and responsive to determining that the error rate satisfies the error threshold criterion, repeating the screening operations until a cycle threshold criterion for a next checkpoint is satisfied.

9. The system of claim 8, wherein the operations further comprise:

responsive to determining that the error rate does not satisfy the error threshold criterion, categorizing the memory die to be associated with a respective reliability bin of a plurality of reliability bins without proceeding to the next checkpoint.

10. The system of claim 8, wherein a memory device with a specific reliability rating is assembled using one or more memory dies selected from a specific reliability bin.

11. The system of claim 10, wherein the cycle threshold criterion is based on correspondence between a number of accelerated seasoning cycles at a high temperature and a number of normal operational cycles performed on the memory device during an operational lifetime.

12. The system of claim 11, wherein the error threshold criterion is set based on a reset margin degradation at a high temperature.

13. The system of claim 12, wherein the error threshold criterion is based on a set margin degradation at a low temperature.

14. The system of claim 10, dynamic seasoning is performed periodically on the memory die during a normal operational lifetime of the memory device after being assembled into a memory device.

15. A non-transitory computer readable medium comprising instructions, which when executed by a processing device, cause the processing device to perform operations comprising:

associating an accelerated seasoning cycle criterion with a memory die of a plurality of memory dies;

subjecting the memory die to one or more accelerated seasoning conditions during accelerated seasoning cycles;

responsive to determining, by a processing device, that the accelerated seasoning cycle criterion has been satisfied, performing a defect scan on the memory die; and associating, by the processing device, the memory die with a respective reliability bin of a plurality of reliability bins in view of a result of the defect scan, wherein the result of the defect scan satisfies one or more predetermined threshold reliability criteria corresponding to the respective reliability bin.

16. The non-transitory computer readable medium of claim 15, the operations further comprising:

selecting one or more memory dies from the respective reliability bin to assemble a memory device with a predetermined reliability rating.

17. The non-transitory computer readable medium of claim 15, wherein the operation of subjecting the memory die to one or more accelerated seasoning conditions comprises: subjecting the memory die to a temperature substantially higher than room temperature during the accelerated seasoning cycles.

18. The non-transitory computer readable medium of claim 17, wherein the operation of performing a defect scan further comprises:

collecting error data corresponding to one or more predetermined write-to-read delay time; and determining, in view of the error data, a degradation of set margin with respect to a reference voltage.

19. The non-transitory computer readable medium of claim 15, the operations further comprising:

responsive to determining, after a first threshold number of seasoning cycles, that the result of the defect scan satisfies the one or more predetermined threshold reliability criteria corresponding to a first reliability bin, increasing a number of accelerated seasoning cycles to a next higher threshold number.

20. The non-transitory computer readable medium of claim 19, wherein a maximum number of accelerated seasoning cycles corresponds to a total number of normal operational cycles that the memory die is expected to experience during an operational lifetime after being assembled into a memory device.

* * * * *